United States Patent [19]
Nagatomo et al.

[11] Patent Number: 5,471,089
[45] Date of Patent: Nov. 28, 1995

[54] SEMICONDUCTOR POWER MODULE

[75] Inventors: Akihiro Nagatomo; Hiroshi Yoshida; Masaki Nishiyama; Seiichi Oshima, all of Fukuoka, Japan

[73] Assignee: Mitsubishi Denki Kabushiki Kaisha, Tokyo, Japan

[21] Appl. No.: 80,781

[22] Filed: Jun. 24, 1993

[30] Foreign Application Priority Data

Jun. 30, 1992 [JP] Japan .................................. 4-172774

[51] Int. Cl.$^6$ ................................................ H01L 23/16
[52] U.S. Cl. ......................... 257/691; 257/692; 257/693; 257/723
[58] Field of Search ................................... 257/666, 691, 257/692, 693, 698, 723, 724, 725, 728, 712, 713

[56] References Cited

U.S. PATENT DOCUMENTS 4,965,710  10/1990  Pelly et al. .

FOREIGN PATENT DOCUMENTS 0277546  8/1988  European Pat. Off. .
0427143  5/1991  European Pat. Off. .
2130954  5/1990  Japan .................................. 257/724

OTHER PUBLICATIONS

Patent Abstracts of Japan, vol. 13, No. 486, (E–840) Nov. 6, 1989 & JP–A–01 194 344, Aug. 4, 1989.

Primary Examiner—Sara W. Crane
Assistant Examiner—Carl Whitehead, Jr.
Attorney, Agent, or Firm—Oblon, Spivak, McClelland, Maier & Neustadt

[57] ABSTRACT

In a semiconductor power module, a surge voltage on a power source line of a semiconductor element for electric power control is restrained. A power source terminal PS(NP) is comprised of power source terminals PS(P) and PS(N) which are arranged adjacent each other through an insulative sheet INS1 made of insulative synthetic resin or the like. The power source terminals PS(P) and PS(N) are each formed by a conductive plate and respectively transmit a positive and negative power source potentials. The thickness of the insulative sheet INS1 is 0.5 mm to 1.5 mm, for instance. A reduction is made in a parasitic inductance which is present in the power source line which extends from the power source terminal PS(P) to the power source terminal PS(N) through the semiconductor element for electric power control, thereby suppressing a surge voltage which is developed between the power source terminal PS(P) and the power source terminal PS(N).

32 Claims, 14 Drawing Sheets

SEMICONDUCTOR POWER MODULE

BACKGROUND OF THE INVENTION

1. Field of the Invention

The present invention relates to a semiconductor power module, and particularly to improvement for suppressing a surge voltage.

2. Description of the Prior Art

A semiconductor power module is a device which comprises a circuit which controls electric power by using an active semiconductor element for electric power control. Some semiconductor power modules further comprise a control circuit which comprises an active semiconductor element. In a semiconductor power module comprising a control circuit, the circuit for controlling electric power mentioned above is regarded as a main circuit and the active semiconductor element of the control circuit controls operations of the main circuit by means of signal transmission between the active semiconductor element and the main circuit. The most commonly encountered application of a semiconductor power module is an invertor or the like for controlling operations of a motor or the like.

FIG. 14 is a plan view of a circuit part of a conventional semiconductor power module. In this device, the normal rated output power is about 0.5 kW and an electric power is cyclically blocked and connected at a frequency of about 5 kHz. In the circuit of this device, conductive wiring patterns P(P), P(N), P(U), P(V), P(W) and P(G1) to P(G6) are formed on the top surfaces of insulative circuit board bodies SB1 to SB3. Insulative gate bipolar transistor elements (IGBT elements) Ta1 to Ta3 and Tb1 to Tb3, which are each constructed as an electric power control semiconductor element, are disposed on the top surfaces of the conductive wiring patterns P(P). IGBT elements Ta4 and Tb4 are disposed on the top surface of the wiring pattern P(U), IGBT elements Ta5 and Tb5 are disposed on the top surface of the wiring pattern P(V), and IGBT elements Ta6 and Tb6 are disposed on the top surface of the wiring pattern P(W). The conductive wiring patterns P(P), which are respectively formed on the top surfaces of the circuit board bodies SB1 to SB3, are electrically connected to each other by jumpers J1 and J2 while the conductive wiring patterns P(N) are electrically connected to each other by jumpers J3 and J4 in a similar manner. The portions shadowed by oblique lines in FIG. 14 represent terminals which are connected to the wiring patterns. A number of conductive wires w attain electrical connection between the IGBT elements and the wiring patterns and electrical connection between the wiring patterns.

The wiring patterns P(P) and P(N) transfer a positive and a negative power source potentials, respectively, and supply a power source current to the IGBT elements. The wiring patterns P(U), P(V) and P(W) each carry each one of three-phase output currents. The wiring patterns P(G1) to P(G6) are wiring patterns for transmitting gate voltages which are developed at the IGBT elements. By connecting an external power source (not shown) to power source terminals PS(P) and PS(N) to which the wiring patterns P(P) and P(N) are connected, the power source potentials and the power source current are supplied to the IGBT elements.

The wiring patterns P(P) and P(N) are located near opposite ends of the circuit board bodies SB1 to SB3. Between the wiring patterns P(P) and P(N), other wiring patterns including the wiring pattern P(U), the IGBT and other elements are disposed. Mounted near the opposite ends of the circuit board bodies SB1 to SB3, the power source terminals PS(P) and PS(N) are spaced apart from each other.

A semiconductor power module having a high frequency is desired since the higher frequency for cyclically blocking and connecting electric power a semiconductor power module has, e.g., about 10 kHz or higher, the better performance the semiconductor power module attains including reduced electric power loss, improvement in response and operation accuracy of an object to be electric-power controlled such as a motor or etc. Another demand for a semiconductor power module is the ability of controlling a larger electric power, for example, an electric power of around 1 kW or more, which is necessary to drive a large, industrial use motor or the like.

The power source current mentioned above intermittently flows because of operations of the IGBT elements. As the power source current flows intermittently, due to a parasitic inductance which is present in the path of the power source current which extends from the power source terminal PS(P) to the power source terminal PS(N) through the wiring patterns P(P), the IGBT elements and the wiring patterns P(N), a surge voltage is developed in the path. The surge voltage increases in proportion to an increase in the value or the frequency of the power source current which is cyclically blocked and connected. If excessively high, the surge voltage causes an electrical noise which leads to circuit failure in the device and eventually to destruction of the circuit elements which form the circuit.

In the conventional device as above, a rather large parasitic inductance exists in the path of the power source current. Hence, circuit failure or destruction of the circuit because of the surge voltage would not be possibly prevented by mere modification in the circuit design such as an increased current capacity of the wirings of the circuit board by incorporating high speed, large current capacity semiconductor elements for electric power control in the structure of the conventional device. Clearly, this is not the answer to the demand for a large power, high frequency semiconductor power module.

SUMMARY OF THE INVENTION

In a first aspect of the present invention, a semiconductor power module comprises: (a) a semiconductor element for electric power control, respectively; (b) a circuit board, comprising: (b-1) a circuit board body having an insulator; and (b-2) a first and a second wiring patterns disposed on one major surface of the circuit board in such a manner that principal pans of the first and the second wiring patterns are adjacent each other, the first and the second wiring patterns transmitting a first and a second power source potentials to the semiconductor element for electric power control; and (c) a first and second power source terminals which are connected to the first and the second wiring patterns, respectively, the first and the second power source terminals being arranged in the vicinity of each other so that power source currents flow in the first and the second wiring patterns in substantially parallel but opposite directions.

In a second aspect of the present invention, a semiconductor power module comprises: (a) a semiconductor element for electric power control; and (b) a power source terminal for transmitting first and second power source potentials to the semiconductor element for electric power control. The power source terminal comprises: (b-1) an insulator and (b-2) a first and a second conductors for transmitting the first and the second power source potentials, respectively, the first and the second conductors being respectively mounted along first and a second major surfaces of the insulative sheet, the first and the second conductors carrying power source currents in substantially parallel but opposite directions.

In a third aspect of the present invention, a semiconductor power module comprises: (a) a semiconductor element for electric power control; (b) a circuit board, comprising: (b-1) a circuit board body having an insulator; and (b-2) a first and a second wiring patterns respectively formed in a first and second different planes which are parallel to a major surface of the circuit board body in such a manner that principal parts of the first and the second wiring patterns are facing each other, the first and the second wiring patterns transmitting a first and second power source potentials to the semiconductor element for electric power control, respectively; and (c) a first and second power source terminals which are connected to the first and the second wiring patterns, respectively, the first and the second power source terminals being arranged in the vicinity of each other so that power source currents flow in the first and the second wiring patterns in substantially parallel but opposite directions.

In a fourth aspect of the present invention, a semiconductor power module comprises: (a) a semiconductor element for electric power control; and (b) a power source terminal for transmitting a first and second power source potentials to the semiconductor element for electric power control, the power source terminal comprises: (b-1) an insulator a substantially plate shape; and (b-2) first and second conductors each for transmitting the first and the second power source potentials, respectively, the first and the second conductors being respectively mounted along a first and a second major surfaces of the first insulative sheet, the first and the second conductors carrying power source currents in substantially parallel but opposite directions; and (c) an external power source terminal connected to the power source terminal by a connection member of an excellent conductivity, the external power source terminal comprising: (c-1) a second shape; and (c-2) third and fourth conductors for transmitting the first and the second power source potentials, respectively, the third and the fourth conductors being respectively mounted along fourth major surfaces of the second insulative sheet, the third and the fourth conductors carrying power source currents in substantially parallel but opposite directions. The power source terminal and the external power source terminal are connected by the connection member in such a manner that the first and the third conductors are in pressure contact and hence in electrical connection to each other, and the second and the fourth conductors, each in pressure contact to the connection member, are electrically coupled to each other through the connection member.

Preferably, in the second aspect of the present invention, the semiconductor power module further comprises (c) a circuit board, the circuit board comprising (c-1) a circuit board body having a plate-like an insulator; and (c-2) a first and a second wiring patterns disposed on one major surface of the circuit board body in such a manner that principal parts of the first and the second wiring patterns are adjacent each other, the first and the second wiring patterns transmitting a first and second power source potentials to the semiconductor element for electric power control, respectively, the first and the second wiring patterns being connected to the first and the second conductors, respectively.

Alternatively, in the second aspect of the present invention, the semiconductor power module further comprises (c) a circuit board, the circuit board comprising (c-1) a circuit board body having an insulator; and (c-2) a first and a second wiring patterns respectively formed in a first and second different planes which are parallel to a major surface of the circuit board body in such a manner that principal parts of the first and the second wiring patterns are facing each other, the first and the second wiring patterns transmitting a first and a second power source potentials to the semiconductor element for electric power control, respectively, the first and the second wiring patterns being connected to the first and the second conductors, respectively.

As heretofore described, according to the first aspect of the present invention, the first and the second wiring patterns for transmitting the first and the second power source potentials to the semiconductor element for electric power control are disposed on the major surface of the circuit board in such a manner that the principal parts of the first and the second wiring patterns are adjacent each other. In addition, the first and the second power source terminals connected to these wiring patterns are disposed adjacent each other so that power source currents flow in the first and the second wiring patterns in substantially parallel but opposite directions. Hence, a parasitic inductance is reduced which is present in the path of the power source current which extends from the first power source terminal to the second power source terminal through the first wiring pattern, the semiconductor element for electric power control and the second wiring pattern. As a result, a surge voltage is suppressed which is created by intermittent variations in a current which flows in the path in accordance with operations of the semiconductor element for electric power control.

According to the second aspect of the present invention, the power source terminal for transmitting the first and the second power source potentials to the semiconductor element for electric power control is comprised of the first and the second conductors and insulator which is interposed between the first and the second conductors. The first and the second power source potentials are transferred by the first and the second conductors, respectively. In these conductors, the power source currents flow in substantially parallel but opposite directions. This restrains a parasitic inductance which is present in the path of the power source current which extends from the first power source terminal to the second power source terminal through the semiconductor element for electric power control. As a result, a surge voltage is suppressed which is created by intermittent variations in a current which flows in the path in accordance with operations of the semiconductor element for electric power control.

According to the third aspect of the present invention, the wiring patterns for transmitting the first and the second power source potentials to the semiconductor element for electric power control are formed on the circuit board in such a manner that their principal pans are facing each other. The first and the second power source terminals connected to these wiring patterns are disposed adjacent each other so that power source currents flow in the first and the second wiring patterns in substantially parallel but opposite directions. Hence, a parasitic inductance is reduced which is present in the path of the power source current which extends from the first power source terminal to the second power source terminal through the first wiring pattern, the semiconductor element for electric power control and the second wiring pattern. As a result, a surge voltage is suppressed which is created by intermittent variations in a current which flows in the path in accordance with operations of the semiconductor element for electric power control.

According to the fourth aspect of the present invention, the power source terminal for transmitting the first and the second power source potentials to the semiconductor element for electric power control is comprised of the first and the second conductors and insulator which is interposed between the first and the second conductors. The first and the second power source potentials are transferred by the first and the second conductors, respectively. In these conductors, the power source currents flow in substantially parallel but opposite directions. The external power source terminal for coupling the external power source and the power source terminal has a similar structure. Hence, a parasitic inductance is reduced which is present in the path of the power source current which extends from the third conductor to the fourth conductor through the semiconductor element for electric power control. As a result, a surge voltage is suppressed which is created by intermittent variations in a current which flows in the path in accordance with operations of the semiconductor element for electric power control. Further, the external power source terminal and the power source terminal are connected to each other by the connection member in an easy manner. Since the first and the third conductors are in direct contact each other and the second and the fourth conductors are coupled through the connection member, an inductance is restrained which is present at the connection part at which the power source terminal and the external power source terminal are connected to each other.

Accordingly, it is an object of the present invention to obtain a high frequency semiconductor power module which is capable of handling a large electric power without causing circuit failure or circuit destruction induced by a surge voltage.

These and other objects, features, aspects and advantages of the present invention will become more apparent from the following detailed description of the present invention when taken in conjunction with the accompanying drawings.

DESCRIPTION OF THE PREFERRED EMBODIMENTS

[First Preferred Embodiment]

<Circuit Structure and Operation of Device 100>

Figure 2:
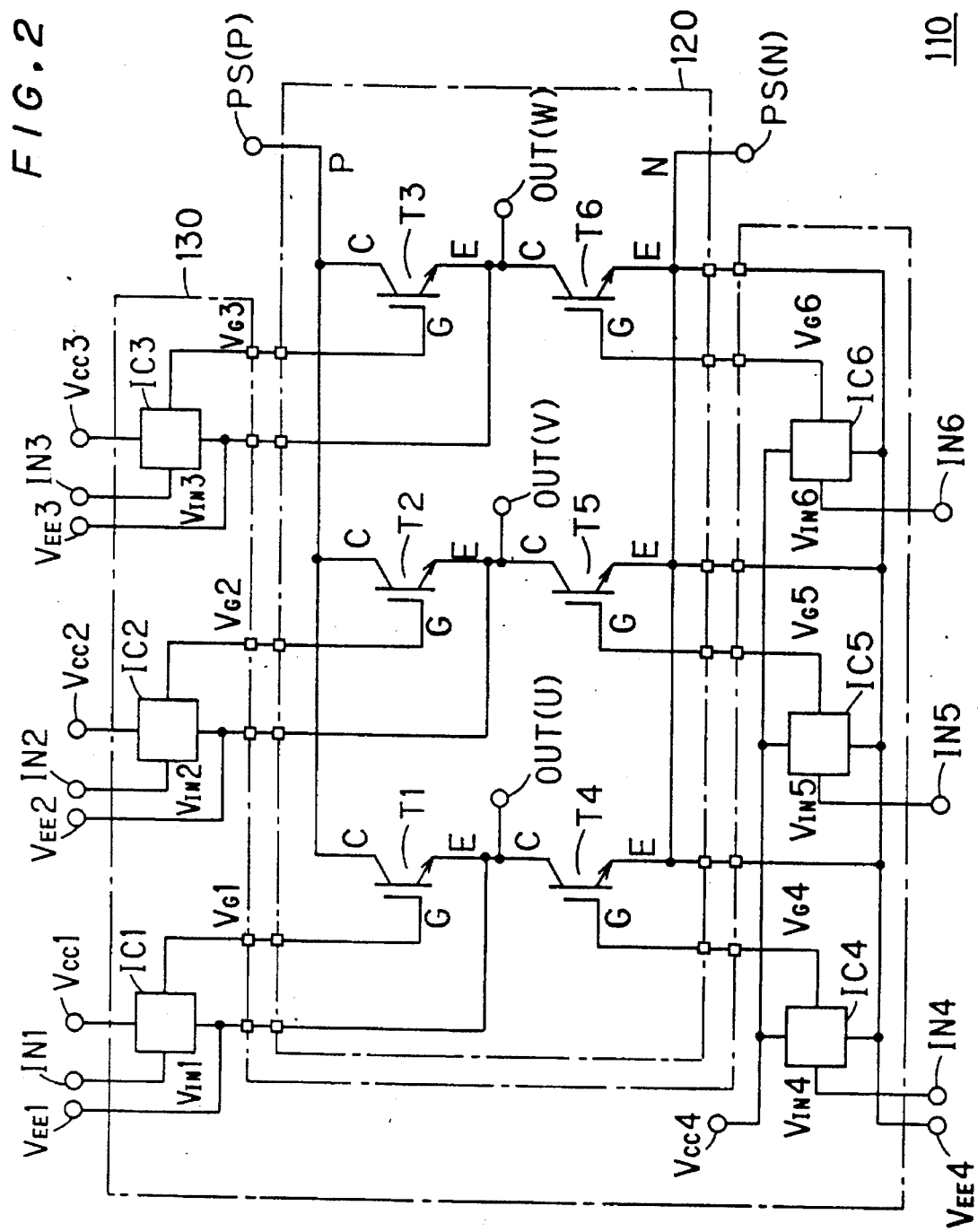
FIG. 2 is a circuitry diagram of a device according to a first preferred embodiment of the present invention.

FIG. 2 is a schematic circuitry diagram showing a principal portion of a circuit 110 of a semiconductor power module 100 according to a first preferred embodiment of the present invention. The normal rated output power and the maximum output current of the device 100 are respectively 440 V and 30 A to 600 A, for instance. A frequency for blocking and connecting an output current is 10 to 20 kHz.

The circuit 110 comprises two circuit parts 120 and 130. The main circuit 120 is a circuit part for control and output of an electric power. A high electric potential P and a low electric potential N of a direct current are applied to a power source terminal PS(P) and a power source terminal PS(N), respectively, from an external power source (not shown). That is, supply of an electric power to the main circuit 120 from the external power source is attained through the power source terminals PS(P) and PS(N). The main circuit 120 comprises six active elements for electric power control, i.e., IGBT elements T1 to T6. An electric power supplied to the main circuit 120 is controlled in accordance with U-, V- and W- three phases to create controlled electric powers which will be respectively outputted outside the device 100 from three output terminals OUT(U), OUT(V) and OUT(W).

The control circuit 130 is a circuit part for control of operations of the IGBT elements T1 to T6. The control circuit 130 comprises six active semiconductor elements IC1 to IC6. The semiconductor elements IC1 to IC6, in response to input signals $V_{IN}1$ to $V_{IN}6$ received at signal input terminals IN1 to IN6 from outside, send gate voltage signals $V_G1$ to $V_G6$ to gates G of the IGBT elements T1 to T6. In response to the gate voltage signals received, the IGBT elements T1 to T6 block and connect currents between collectors C and emitters E.

Four independent external direct current voltage sources (not shown) are respectively connected to associated power source terminal pairs which are formed by high potential side (positive) power source terminals $V_{cc}1$ to $V_{cc}4$ and low potential side (negative) power source terminals $V_{EE}1$ to $V_{EE}4$, whereby supply of a dc voltage to the semiconductor elements IC1 to IC6 is attained through these power source terminals. The negative power source terminals $V_{EE}1$ to $V_{EE}3$ are electrically connected to the emitters E of the IGBT elements T1 to T3. The negative power source terminal $V_{EE}4$ is connected to the emitters E of the IGBT elements T4 to T6 which are at a common electric potential.

The main circuit 120 is to conduct a relatively large current, and therefore, its circuit structure is designed to endure a large current and accompanying large heat generation. On the other hand, the control circuit 130, intended to process a voltage signal, is to carry a very small current. Hence, the circuit structure of the control circuit 130 is not designed to handle a large current.

<Appearance of Device 100>

Figure 3:
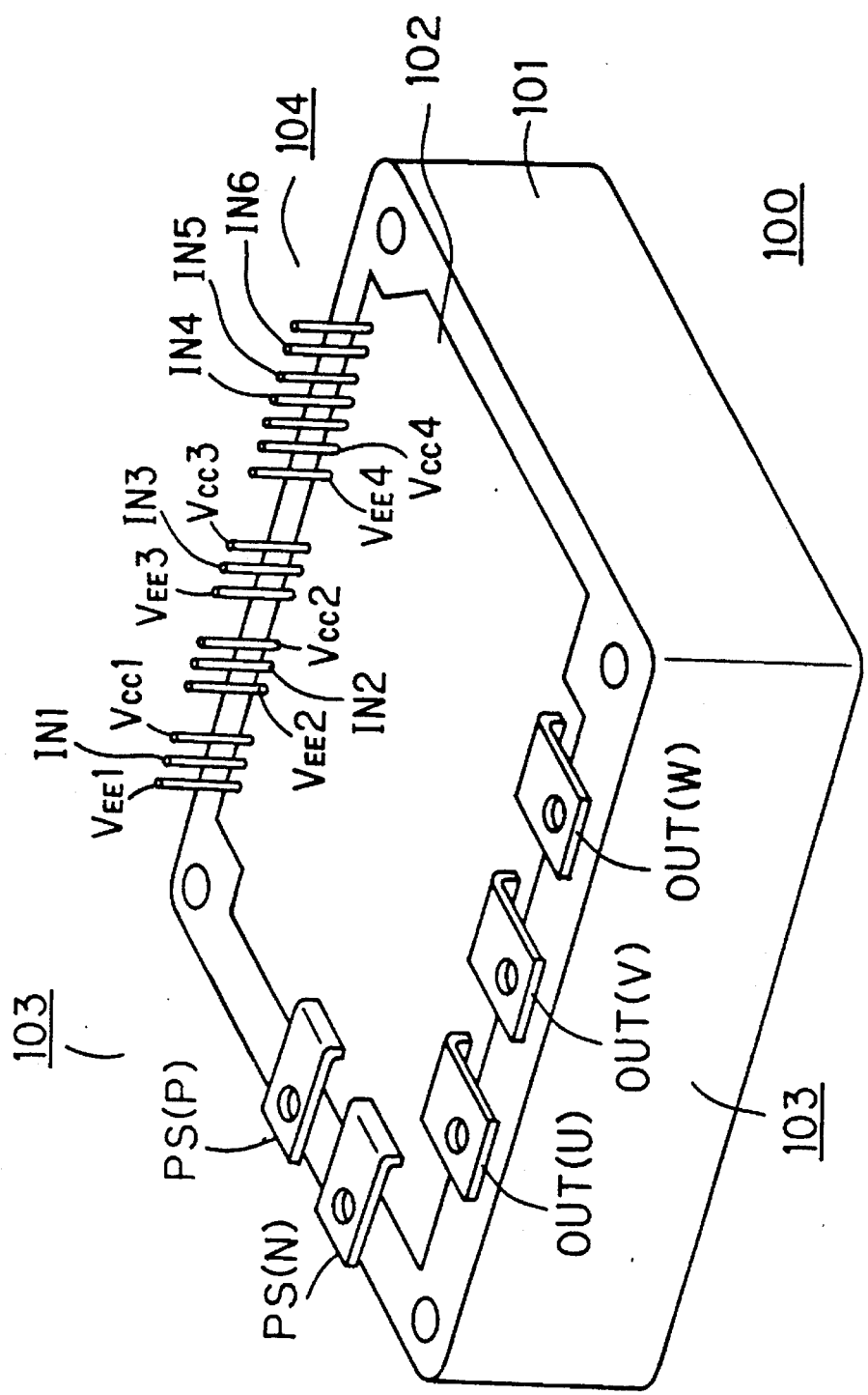
FIG. 3 is a perspective view showing the appearance of the device of the first preferred embodiment of the present invention.

FIG. 3 is a perspective view showing the appearance of the device 100. The device 100 comprises a case 101 which is made of insulative material such as synthetic resin. On the top surface of the case 101, a lid 102 is placed. A terminal 103 of the main circuit 120 and a terminal 104 of the control circuit 130 are projected from the top surface of the case 101 to outside the device 100.

<Arrangement of Circuit Elements in Main Circuit 120>

Figure 4:
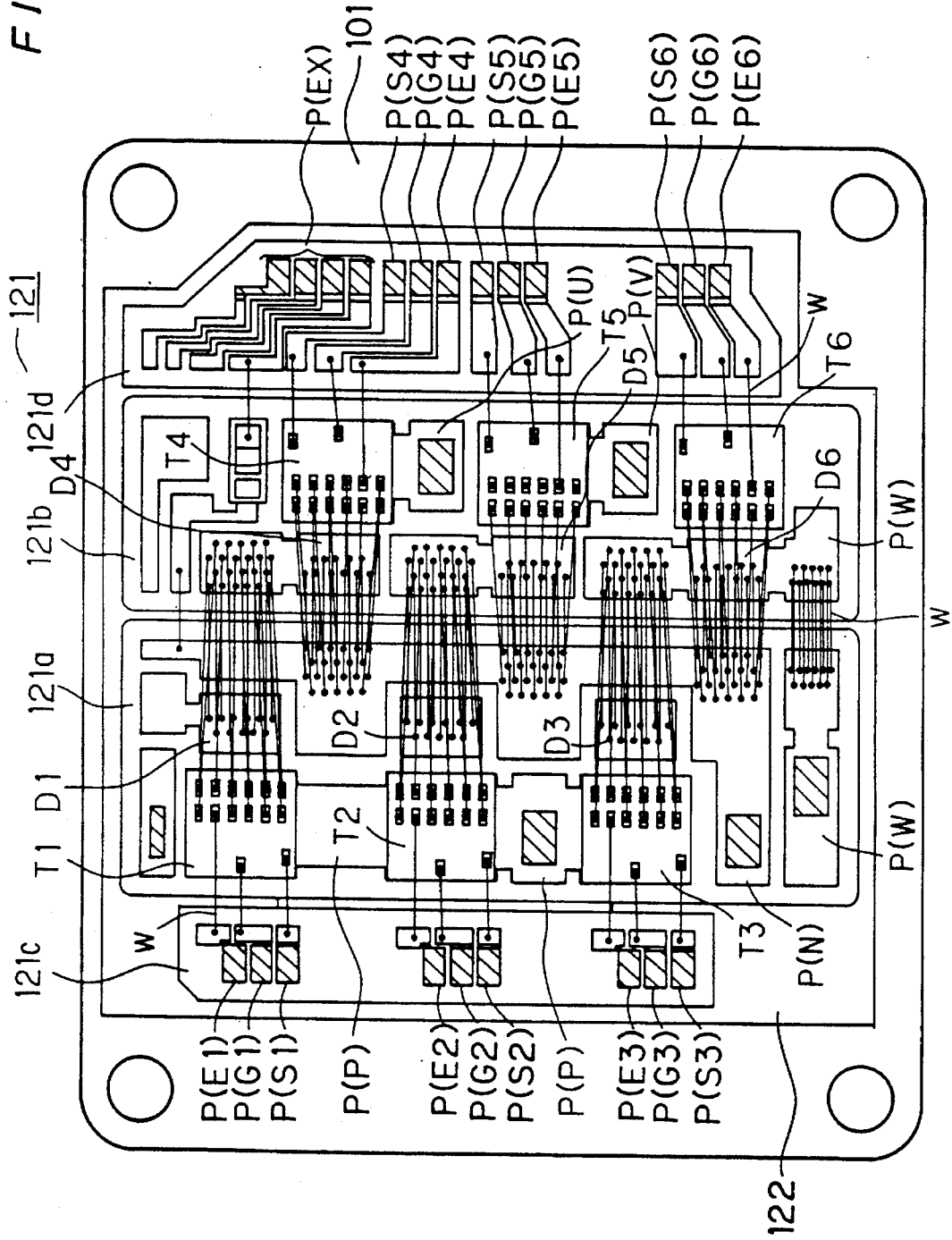
FIG. 4 is a plan view showing a circuit board and an area around the same of a main circuit of the first preferred embodiment of the present invention.

FIG. 4 is a plan view of a circuit board 121 of the main circuit housed in the case 101 at a predetermined location. The circuit board 121 comprises four circuit board bodies 121a to 121d which are disposed on the top surface of a copper base 122 which forms the bottom of the case 101. On the circuit board bodies 121a to 121d, the IGBT elements T1 to T6, passive circuit elements D1 to D6 associated to the IGBT elements T1 to T6 and the wiring patterns are disposed. The wiring patterns P(P), P(N), P(U), P(V) and P(W) transmit the high electric potential P, the low electric potential N, the U-phase output, the V-phase output and the W-phase output, respectively. These wiring patterns are enough wide and thick to carry a large current. The wiring patterns are each connected to associated one of the power source terminals PS(P) and PS(N) and the output terminals OUT(U), OUT(V) and OUT(W) at a portion which is shadowed with oblique lines.

The circuit board bodies 121c and 121d are a body part of the circuit board for connecting the IGBT elements T1 to T6 and the control circuit 130. Of wiring patterns which are formed on the circuit board bodies, wiring patterns P(E1) to P(E6) are each connected to each one of the emitters E of the IGBT elements T1 to T6, the wiring patterns P(G1) to P(G6) are each connected to each one of the gates G of the IGBT elements T1 to T6. The IGBT elements T1 to T6 each comprise a detection circuit for detecting a current which flows through the collector C of the IGBT element (i.e., collector current) and for sending a voltage signal which corresponds to the collector current. Wiring patterns P(S1) to P(S6) are connected to the detection circuits of the IGBT elements T1 to T6 and transmit the detection signals regarding the collector currents. The wiring pattern P(EX) is a wiring pattern for transmitting other signal.

These wiring patterns are each connected, at a portion which is shadowed with oblique lines in the drawing, to an end of one of conductive pins (described later) which are connected to the control circuit 130 (FIG. 2). In other words, the wiring patterns are electrically connected to the control circuit 130 through the conductive pins. Electrical connection is attained among the afore-mentioned elements and between the elements and the wiring patterns by means of a number of conductive wires w.

The wiring patterns P(P) and P(N) formed on the circuit board body 121a transmit a positive and a negative power source potentials to the IGBT elements T1 to T6 to thereby supply the power source current to the IGBT elements T1 to T6. Hence, a large current flows in the wiring patterns P(P) and P(N) while intermittently and rapidly varying in accordance with operations of the IGBT elements T1 to T6. In general, wirings which form a circuit include a parasitic inductance. The inductance gives rise to a high surge voltage in the wirings when a large current flows in the wirings and changes rapidly.

In the device 100 of this embodiment, the wiring patterns P(P) and P(N), in which a large current rapidly and intermittently varies, are disposed on the circuit board body 121a with most areas (principal parts) located adjacent each other. Since, alike wiring patterns P(P) and P(N), the power source terminals PS(P) and PS(N) connected to the wiring patterns P(P) and P(N) are disposed in the vicinity to each other, power source currents flow in the wiring patterns P(P) and P(N) approximately parallel to each other but in opposite directions, i.e., these currents flow in substantially parallel but opposite directions. As mentioned above, the power source terminals PS(P) and PS(N) are disposed close to each other. For these reasons, a reduction is made in a parasitic inductance which is present in the path which extends from the power source terminal PS(P) to the power source terminal PS(N) through the wiring pattern P(P), the IGBT elements T1 to T6 and the wiring pattern P(N). A result of this is a reduced surge voltage which is created in the path due to a variation in the current.

<Arrangement of Circuit Elements in Control Circuit 130>

Figure 5:
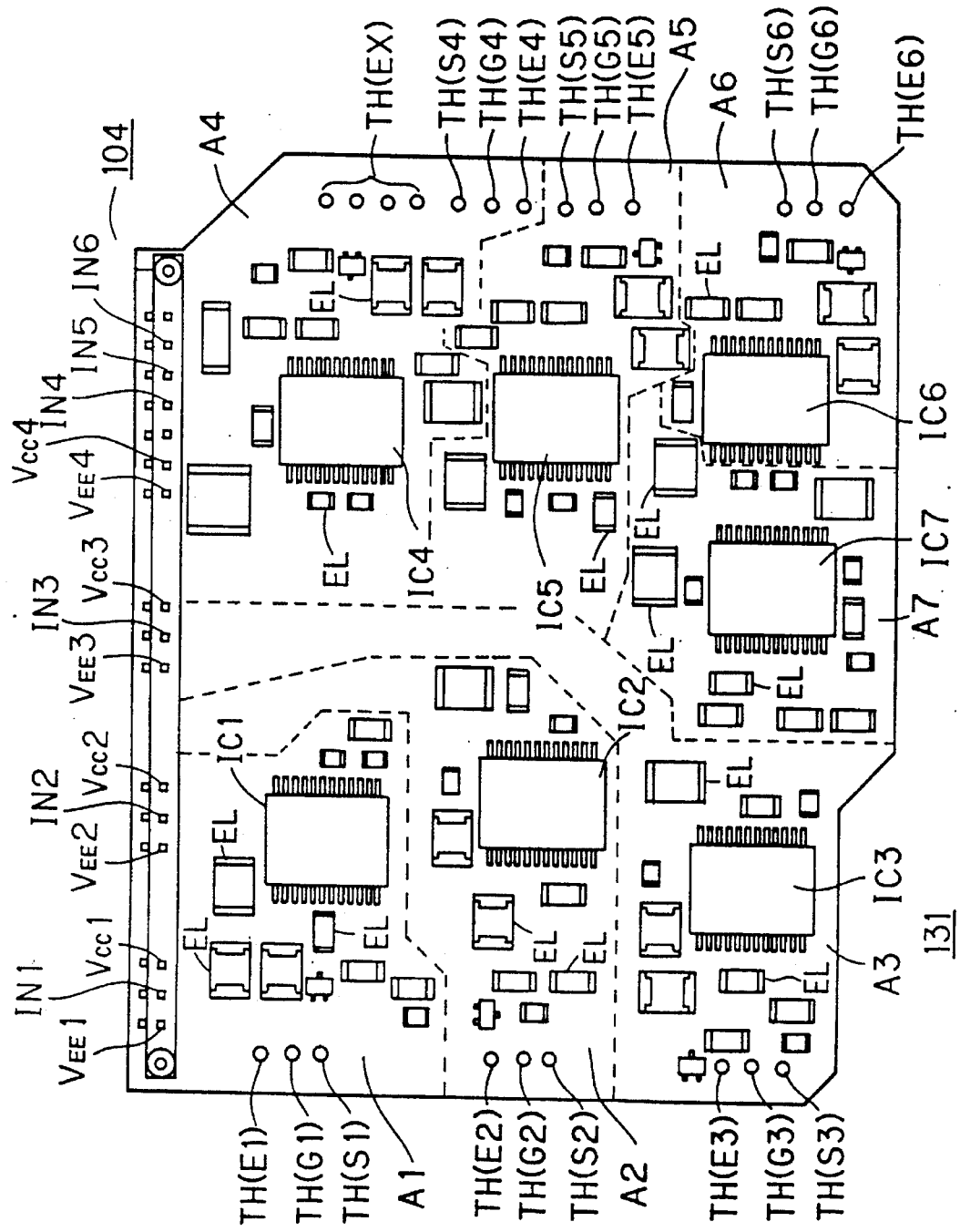
FIG. 5 is a plan view showing a circuit board of a control circuit of the first preferred embodiment of the present invention.

FIG. 5 is a plan view of a circuit board 131 of the control circuit 130. Since the device 100 is used in a large current, the control circuit 130 is formed on a different board from the board mounting the main circuit 120 in which large heat is generated. On the circuit board 13 1, active semiconductor elements IC1 to IC7, passive circuit elements EL associated with the semiconductor elements IC1 to IC7 and wiring patterns are seated. To prevent malfunction of the semiconductor elements IC1 to IC7 which is induced by an electrical noise, the semiconductor elements IC1 to IC7 and the circuit elements EL associated with the same are located close to each other. That is, the major surface of the circuit board 131 is conceptually divided into a plurality of separated areas A1 to A7 by imaginary boundaries shown with the dotted lines in FIG. 5. In each one of the areas A1 to A7, one of the semiconductor elements IC1 to IC7 and the associated circuit element EL are arranged. Unlike the semiconductor elements IC1 to IC6, the semiconductor element IC7 is formed for a different purpose.

Through holes connected to the wiring patterns are formed in the circuit board 13 1 and other ends of the above-mentioned conductive pins are connected to the through holes. Via the conductive pins, the through holes TH(E1) to TH(E6), TH(G1) to TH(G6), TH(S1) to TH(S6) and TH(EX) are respectively connected to the wiring patterns P(E1) to P(E6), P(G1) to P(G6), P(S1) to P(S6) and P(EX). The circuit board 131 comprises the terminal 104 which is connected to the wiring patterns and further to the external power source and the like mentioned earlier.

Figure 6:
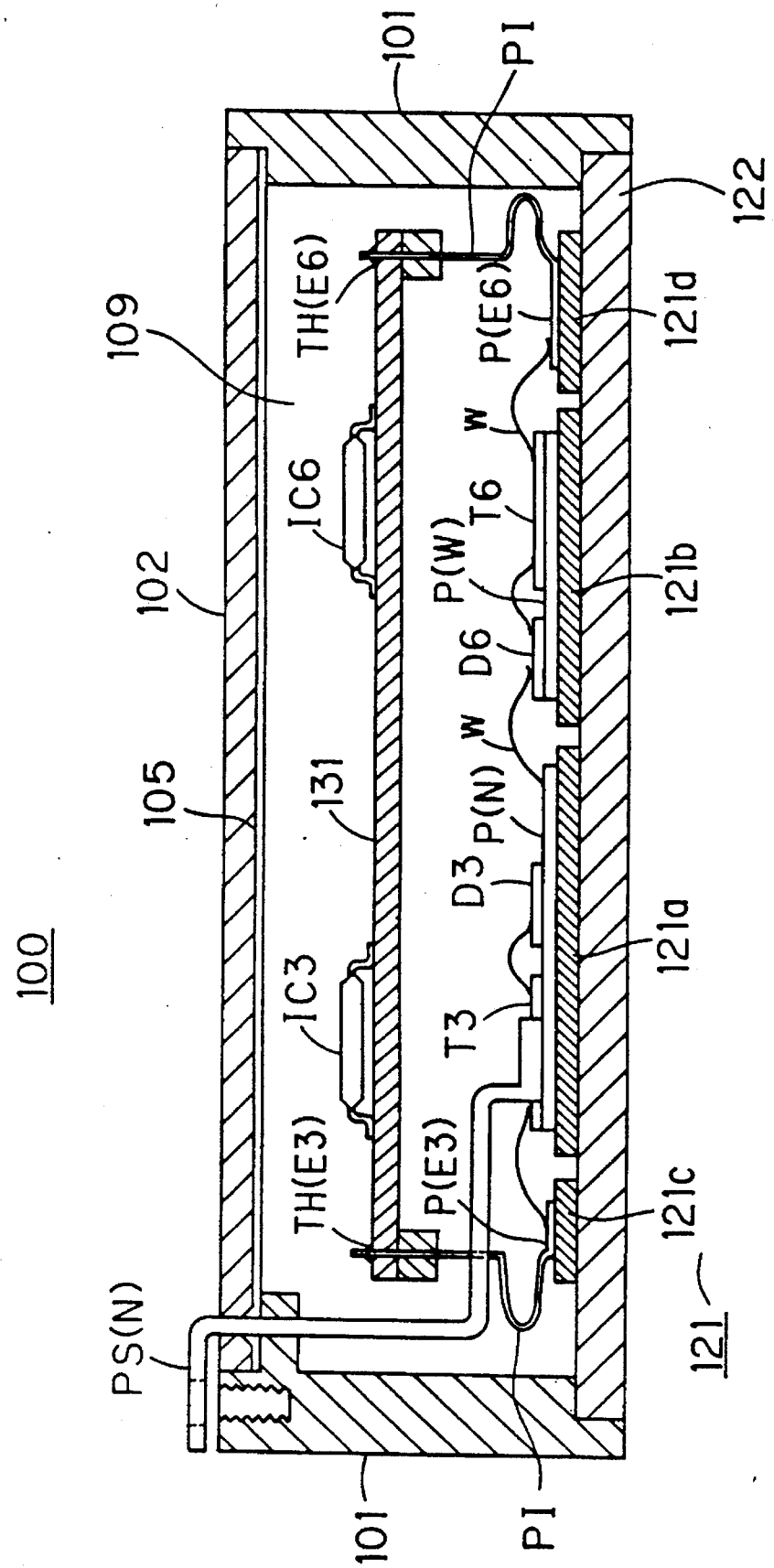
FIG. 6 is a front cross sectional view of the device of the first preferred embodiment of the present invention.

The circuit elements formed on the circuit boards 121 and 131 are arranged so that each one of the semiconductor elements IC1 to IC6 and the associated circuit element EL are located approximately above the relevant one of the IGBT elements T1 to T6 to be controlled and the relevant one of the circuit elements D1 to D6 when the circuit boards are disposed to face each other one above the other as shown in FIG. 6. For example, the area A1 of the circuit board 131 including the semiconductor element IC1 and its associated circuit element EL is to be located approximately right above the circuit board 121 at an area in which the IGBT element T1, the associated circuit element D1 and the like are arranged. This is also true of the other areas A2 to A7. By arranging the circuit elements in this manner, it is possible to further suppress malfunction of the semiconductor elements IC1 to IC6 which would be caused by an electrical noise from the circuit which is formed on the circuit board 121.

The negative power source potential at the semiconductor elements IC1 to IC4 and IC7 is the same as the common emitter potential of the IGBT elements T4 to T6. Hence, in the circuit board 131, the areas A4 to A7 are each required only to be located above the circuit board 131 at an region where the IGBT elements T4 to T6 are included.

<Cross Sectional Structure of Device 100>

FIG. 6 is a front cross sectional view of the device 100. To finish the device 100 even smaller, the circuit boards 131 and 121 are arranged one above the other in the device 100. As described above, a plurality of conductive pins PI electrically connect the circuit which is formed on the circuit board 121 to the circuit which is formed on the circuit board 131. The circuit board bodies 121a to 121d are made of ceramic or aluminum nitride and the bottom surfaces of the circuit board bodies 121a to 121d are entirely covered with copper foils. By soldering the copper foil surfaces onto the top surface of a copper base 122, the circuit board 121 is fixed to the copper base 122. On the top surface of the circuit board 121, the wiring patterns such as P(N) and P(W) are formed. On these wiring patterns, circuit elements such as the IGBT elements T3 and T6 are soldered.

The copper base 122 which occupies most of the bottom of the device 100 is intended primarily for heat dissipation. More precisely, the copper base 122 discharges heat which is generated by power loss in the main circuit 120 to outside the device 100 to thereby prevent an excessive increase in the temperatures of the main circuit 120 and the control circuit 130.

The lid 102 is made of electrically insulative material such as synthetic resin. The bottom surface of the lid 102 is approximately covered in its entirety with a copper sheet 105 applied thereto. The copper sheet 105 is electrically connected to the power source terminal PS(N) and insulated from the other terminals except for the power source terminal PS(N), namely, the terminals 103 and 104. This means that an electric potential at the copper sheet 105 is kept the same as the lower electric potential N, or a stable potential of the device 100. Hence, the copper sheet 105 shields an electromagnetic radiation noise. That is, the copper sheet 105 prevents the control circuit 103 and the like from malfunctioning by allowing less electromagnetic radiation noise into the device 100. The copper sheet 105 also arrests leakage of an electromagnetic radiation noise which is generated in the main circuit 120 and the like to outside the device 100.

Actual use of the device 100 requires that the external power source and other external device connected to the device 100 are disposed in the vicinity of the device 100. However, since the bottom of the device 100, to which the circuit board 121 creating large heat is mounted, includes a heat dissipation structure as described earlier, the external device is to be disposed on the top surface of the device 100. This is the reason why the terminals 103 and 104 are located in the top surface of the device 100. The external device connected to the terminal 103 is a source of a particularly strong electrical noise which I0 could cause the control circuit 130 to fail to normally operate upon entrance into the control circuit 130. The structure that the copper sheet 105 is attached to the lid 102 effectively prevents entrance of an electrical noise into the control circuit 130.

[Second Preferred Embodiment]

A semiconductor power module 200 according to a second preferred embodiment of the present invention is equal to the device 100 of the first preferred embodiment as it is modified to further obviate a surge voltage by means of an improved structure as to the power source terminals PS(P) and PS(N).

<Arrangement of Wiring Patterns in Main Circuit 120>

Figure 7:
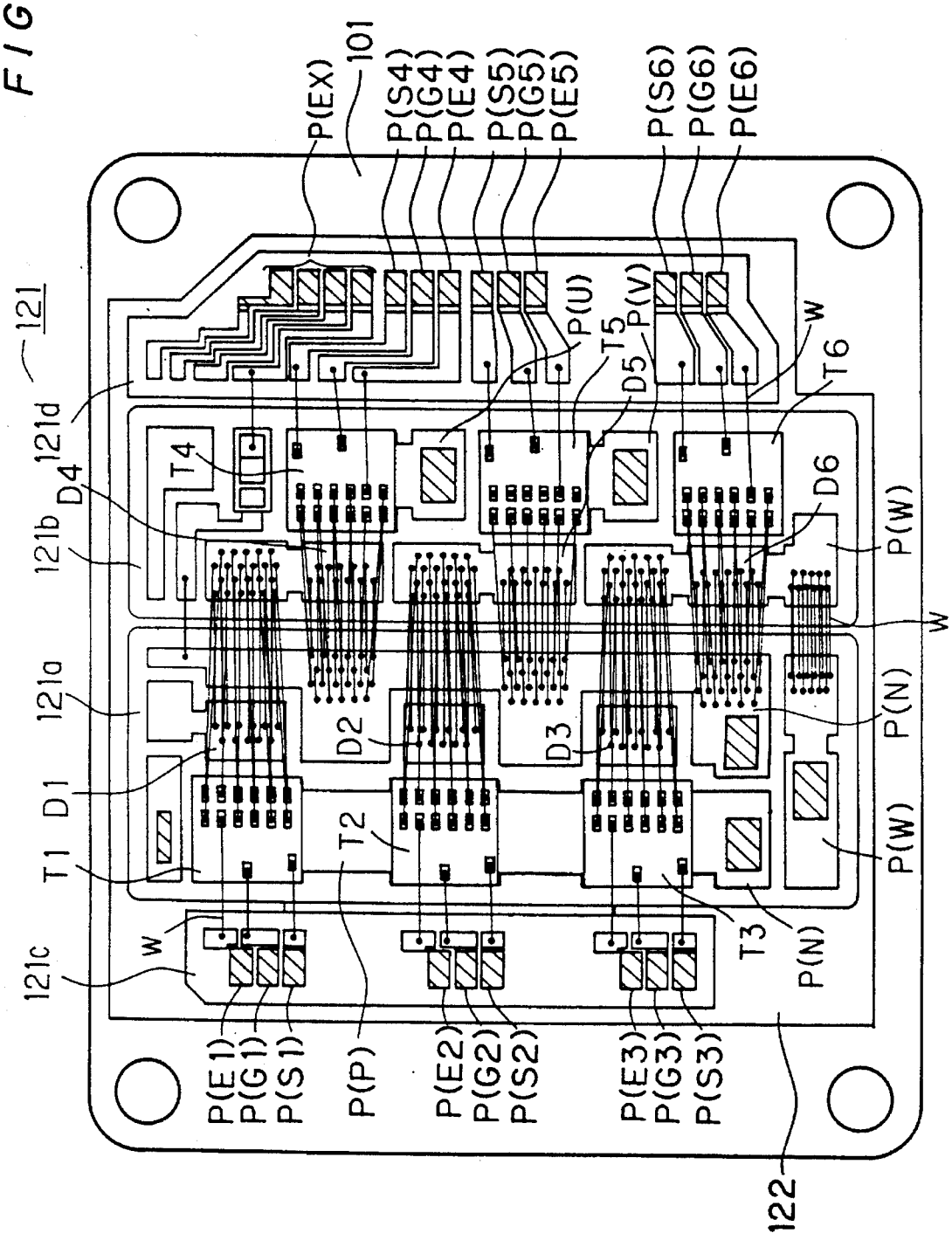
FIG. 7 is a plan view showing a circuit board and an area around the same in the second preferred embodiment of the present invention.

FIG. 7 is a plan view of the circuit board 121 of the main circuit which is mounted within the case 101 of the device 200 at a predetermined location. The principal part of the circuit 110 of the device 200 is similar to that of the device 100 as schematically shown in FIG. 2. Likewise in the device 100, the wiring patterns P(P) and P(N) of the circuit board 121 are formed on the circuit board body 121a in the vicinity to each other.

Figure 8:
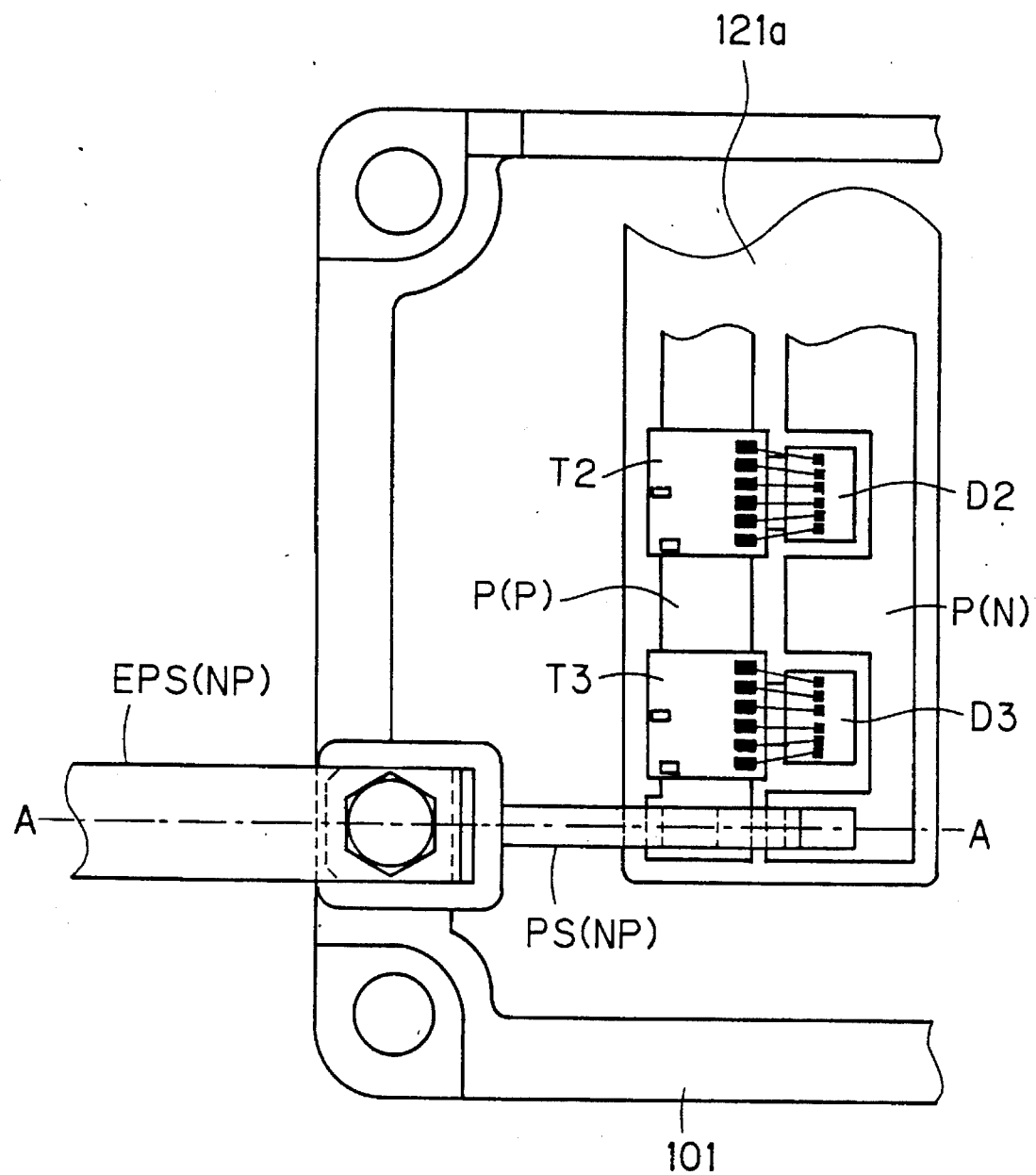
FIG. 8 is a partially expanded plan view showing a connection part at which power source terminals and wiring patterns are connected in the second preferred embodiment of the present invention.

FIG. 8 is a partially expanded plan view showing a connection part at which the power source terminals PS(P) and PS(N) and the wiring patterns P(P) and P(N) are connected. As shown in FIG. 8, the power source terminals PS(P) and PS(N) are incorporated into one power terminal PS(NP). An external power source terminal EPS(NP) is a terminal which is electrically connected to the power source terminal PS(NP) and connects the external power source to the power source terminal PS(NP).

<Structure of Poser Source Terminal PS(NP)>

Figure 1:
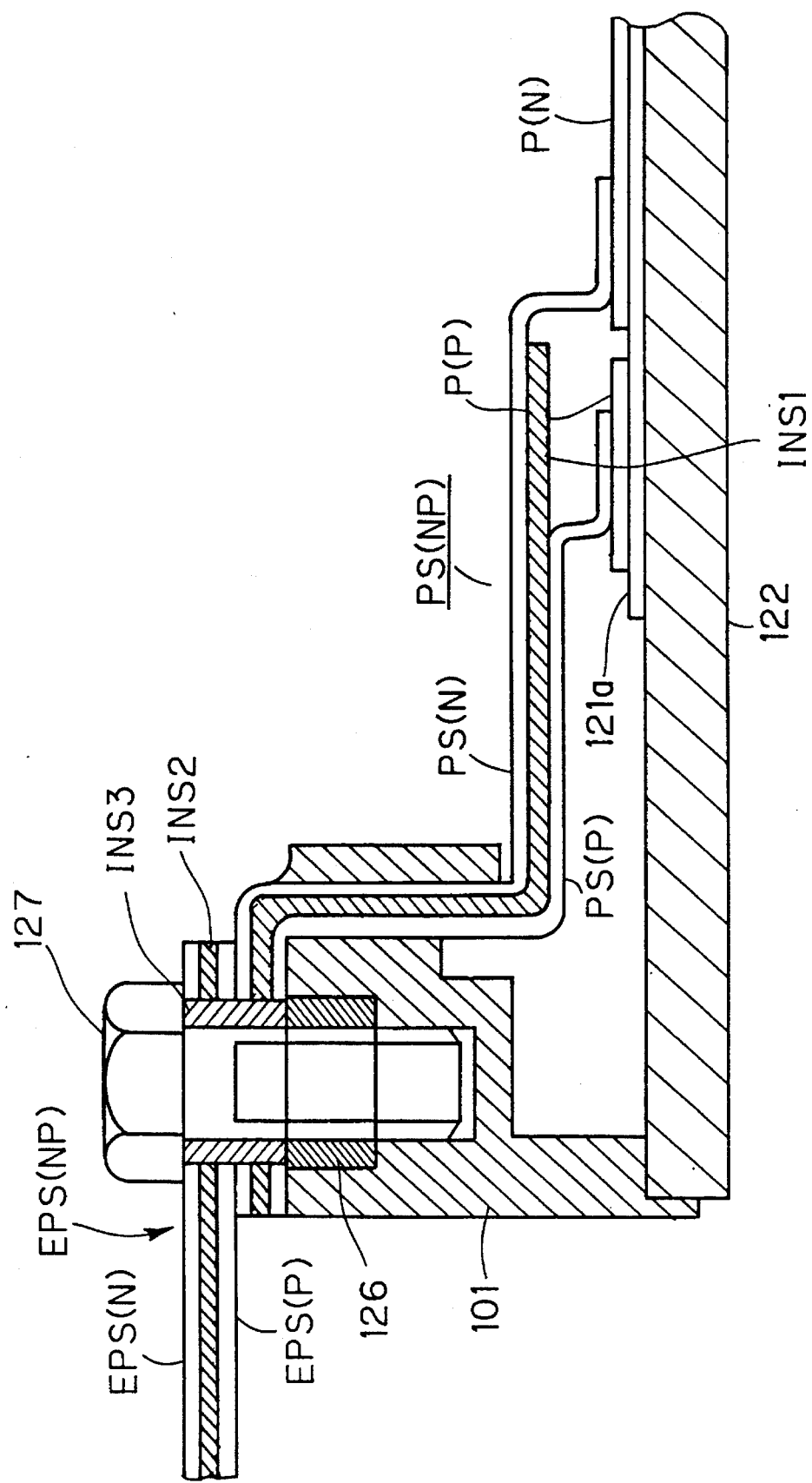
FIG. 1 is a cross sectional view showing a power source terminal and an area around the same in a second preferred embodiment of the present invention.

FIG. 1 is a cross sectional view taken along the line A—A of FIG. 8. Inside the power source terminal PS(NP), the two power source terminals PS(P) and PS(N) each formed by a conductive plate are arranged adjacent each other through a plate-like insulative sheet INS1 made of insulative synthetic resin or the like sandwiched therebetween. As is apparent from FIG. 8, INS1 is a flat thin member extending along conductors PS(N) and PS(P). The power source terminals PS(P) and PS(N) are electrically connected to the wiring patterns P(P) and P(N), respectively. The insulative sheet INS1 is 0.5 mm to 1.5 mm in thickness, for instance. Hence, with the insulative sheet INS1 interposed, currents flow in the power source terminals PS(P) and PS(N) very close to each other in parallel but opposite directions. As a result, as compared with the device 100, a further reduction is made in the parasitic inductance which is created in the path which is formed by the power source terminal PS(P), the wiring pattern P(P), the IGBT elements T1 to T6, the wiring pattern P(N) and the power source terminal PS(N), which in turn further reduces a surge voltage which is created in the path in the device 200.

The power source terminal PS(NP) is connected to the external power source terminal EPS(NP). The external power source terminal EPS(NP) is also comprised of external power source terminals EPS(P) and EPS(N) which are each formed by a conductive plate and arranged adjacent each other with an insulative sheet INS2 made of insulative synthetic resin or the like sandwiched therebetween. The insulative sheet INS2 has the same thickness as that of the insulative sheet INS1. The power source terminal (NP) and the external power source terminal EPS(NP) are bolted together by a conductive nut 126 which is buried in the top surface of the case 101 and a conductive bolt 127 which is engaged with the nut 126. An insulative bushing INS3 is a cylindrical insulator and electrically insulates the bolt 127 from the power source terminals PS(P) and PS(N) and from the external power source terminals EPS(P) and EPS(N). The power source terminal PS(N) and the external power source terminal EPS(N), being in contact each other, are electrically connected to each other. The power source terminal PS(P) and the external power source terminal EPS(P) are electrically connected to each other through the conductive nut 126 and the conductive bolt 127. The structure as above restrains the inductance present in the path mentioned above which includes the external power source terminals EPS(P) and EPS(N), and hence, reduces a surge voltage which is created in the path.

<Appearance of Device 200>

Figure 9:
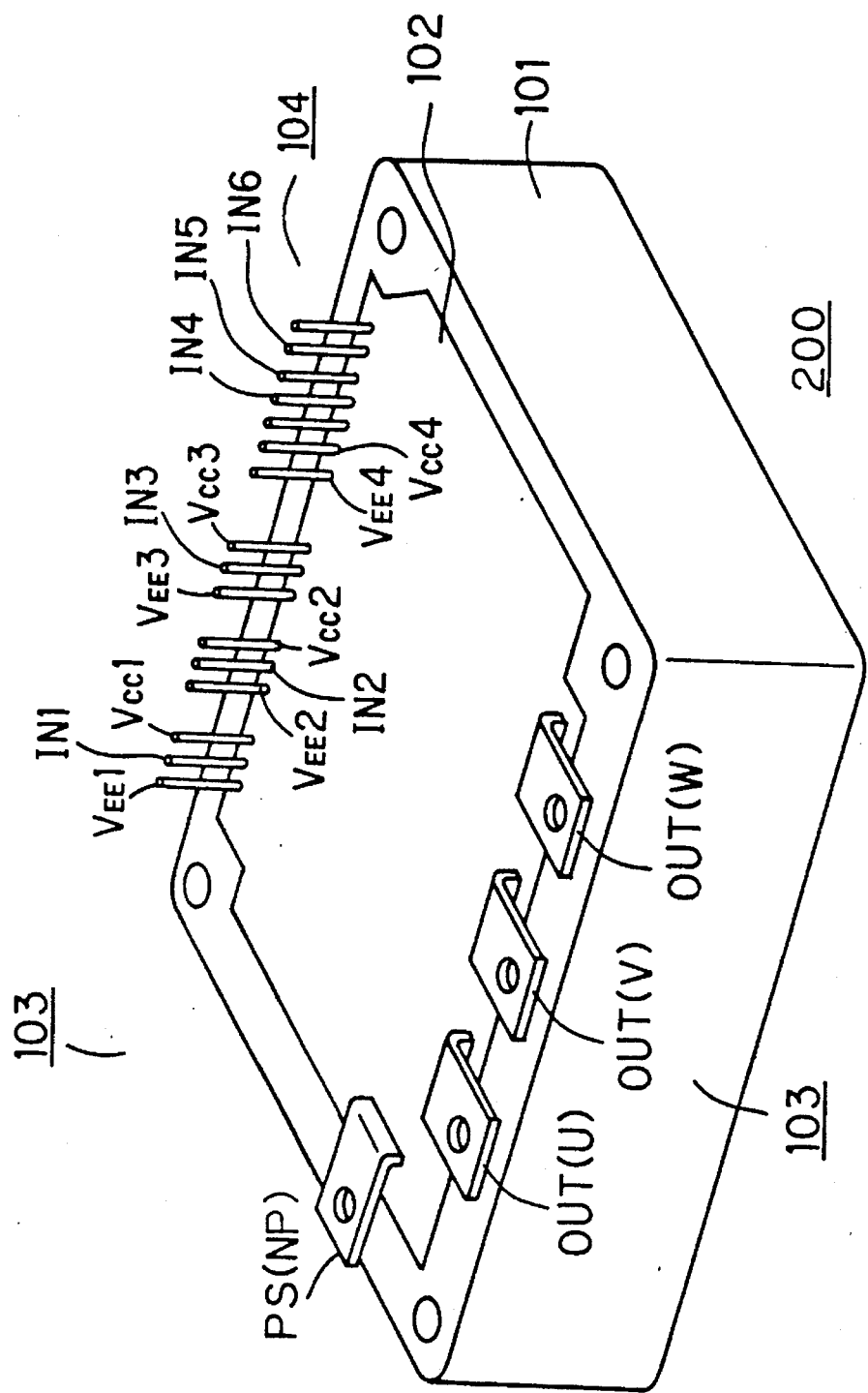
FIG. 9 is a perspective view showing the appearance of the device of the second preferred embodiment of the present invention.

FIG. 9 is a perspective view showing the appearance of the device 200. In the device 200, instead of the power source terminals PS(P) and PS(N) which are disposed in the device 100 separately from each other, one power source terminal PS(NP) is disposed as it is partially projected from the top surface of the case 101. In FIG. 9, the external power source terminal EPS(NP) is omitted.

[Third Preferred Embodiment]

Figure 10:
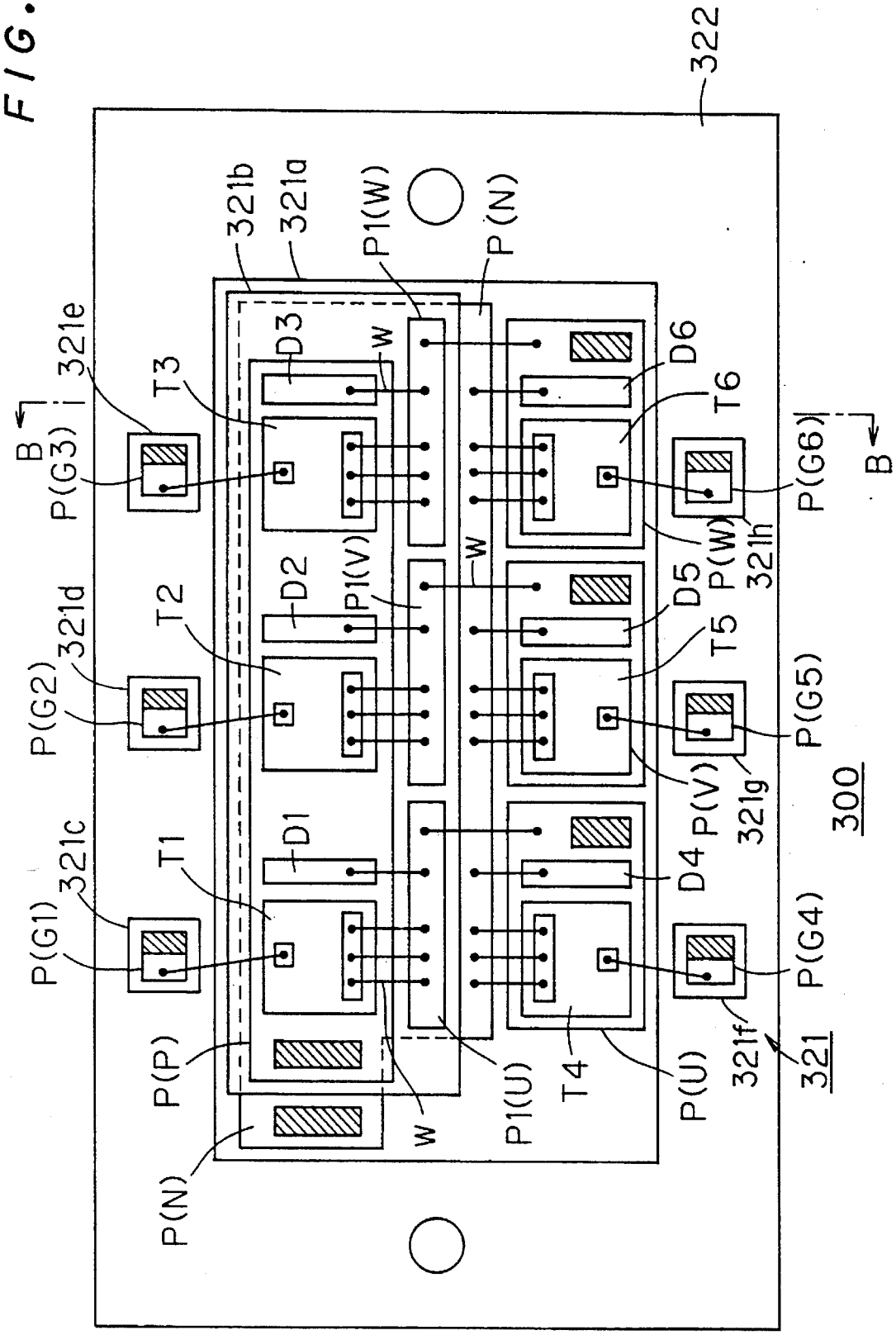
FIG. 10 is a plan view showing a circuit board and an area around the same in the third preferred embodiment of the present invention.
Figure 11:
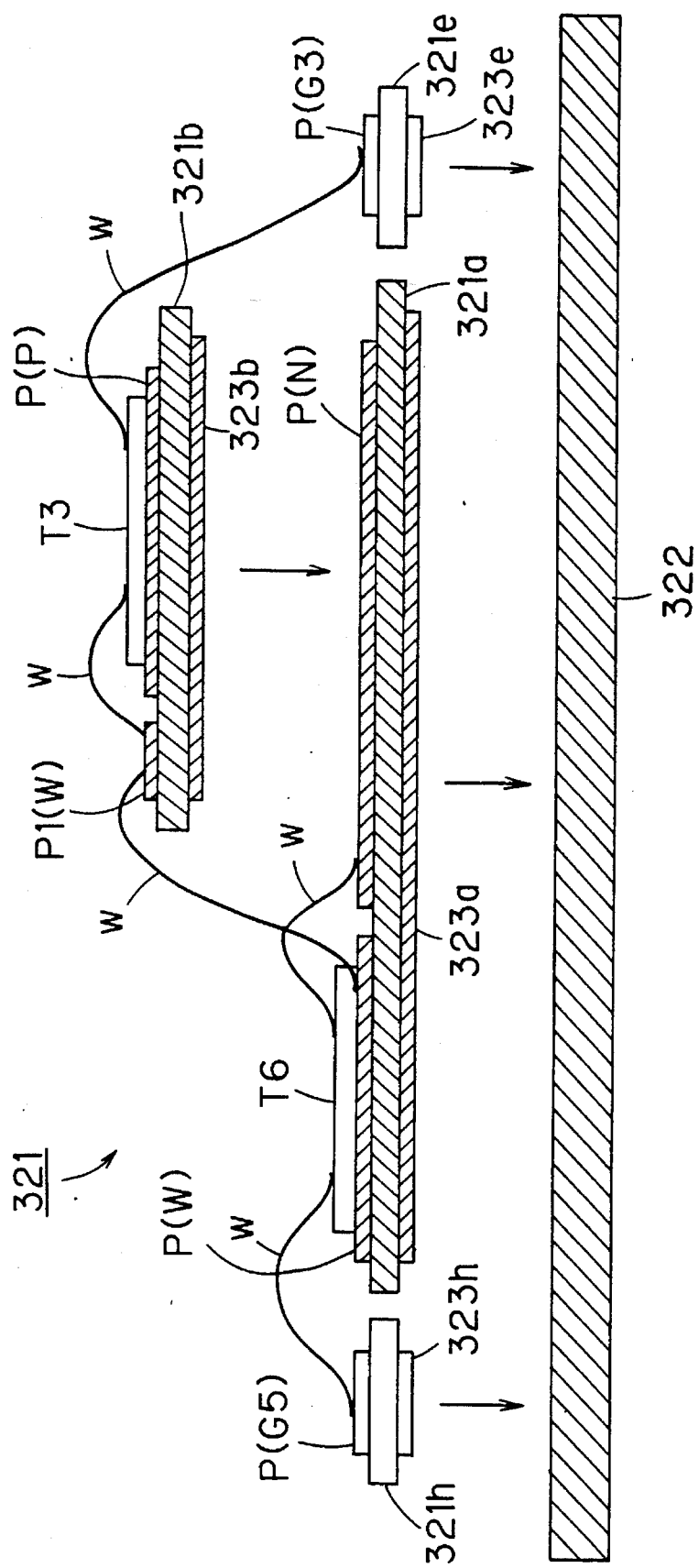
FIG. 11 is a cross sectional view taken along the line B—B of FIG. 10.

FIG. 10 is a plan view of a circuit board 321 which comprises a copper base 322, which forms the bottom of a semiconductor power module 300 of a third preferred embodiment of the present invention, and the device 300 mounted on the copper base 322. The device 300 comprises a circuit which corresponds to the main circuit 120 which is schematically illustrated in FIG. 2. On the other hand, a circuit which corresponds to the control circuit 130 is not formed. The cross section along the line B—B of FIG. 10 is shown in FIG. 11. In FIG. 11, the respective parts are shown separately from each other.

The circuit board 321 includes seven circuit board bodies 321a to 321h. The circuit board bodies 321a to 321h are each made of ceramic or aluminum nitride and the bottom surfaces of the circuit board bodies 321a to 321h are approximately entirely covered with copper foils 323a to 323h respectively (FIG. 11 shows only the copper foils 323a, 323b, 323e and 323h). The surfaces of the copper foils 323a and 323c to 323h are soldered to the top surface of a copper base 322, whereby the circuit board bodies 321a and 321c to 321h are fixed to the copper base 322. The copper base 322 which occupies most of the bottom of the device 300 is intended primarily for heat dissipation. More precisely, the copper base 322 discharges heat which is generated by power loss in the circuit to outside the device 300 to thereby prevent an excessive increase in the temperature of the circuit.

On the top surface of the circuit board body 321a, the wiring pattern P(N) for maintaining the low electric potential N and the wiring patterns P(U), P(V) and P(W) for respectively transmitting the U-, the V- and the W-phase outputs are formed. Formed on the top surface of the circuit board body 321b are the wiring pattern P(P) for maintaining the high electric potential P and wiring patterns P1(U), P1(V) and P1(W) which are respectively electrically connected by conductive wires w to the wiring patterns P(U), P(V) and P(W) which respectively transmit the U-, the V- and the W-phase outputs. On the top surfaces of the circuit board bodies 321c to 321h, wiring patterns P(G1) to P(G6) are formed, respectively. The wiring patterns P(G1) to P(G6) are wiring patterns for transmitting the gate voltage signals $V_G1$ to $V_G6$ for the IGBT elements T1 to T6.

The IGBT elements T1 to T3 and the passive circuit elements D1 to D3 are formed on the top surface of the wiring pattern P(P). The IGBT elements T4 to T6 and the passive circuit elements D4 to D6 are soldered to the top surfaces of the wiring patterns P(U), P(V) and P(W), respectively. The respective elements and the wiring patterns are electrically connected to each other by the conductive wires w where necessary. By soldering the copper foil 323b to the wiring pattern P(P) surface to surface, the circuit board body 321b is fixed on the circuit board body 321a.

The wiring patterns P(P), P(N), P(U), P(V), P(W) and P(G1) to P(G6) are connected to the power source terminals PS(P) and PS(N), the output terminals OUT(U), OUT(V), OUT(W) and the input terminals PS(G1) to PS(G6) to electrically connect the wiring patterns to outside the device 300. In FIG. 10, it is at portions which are shadowed with oblique lines where the wiring patterns and the terminals are connected to each other.

Figure 12:
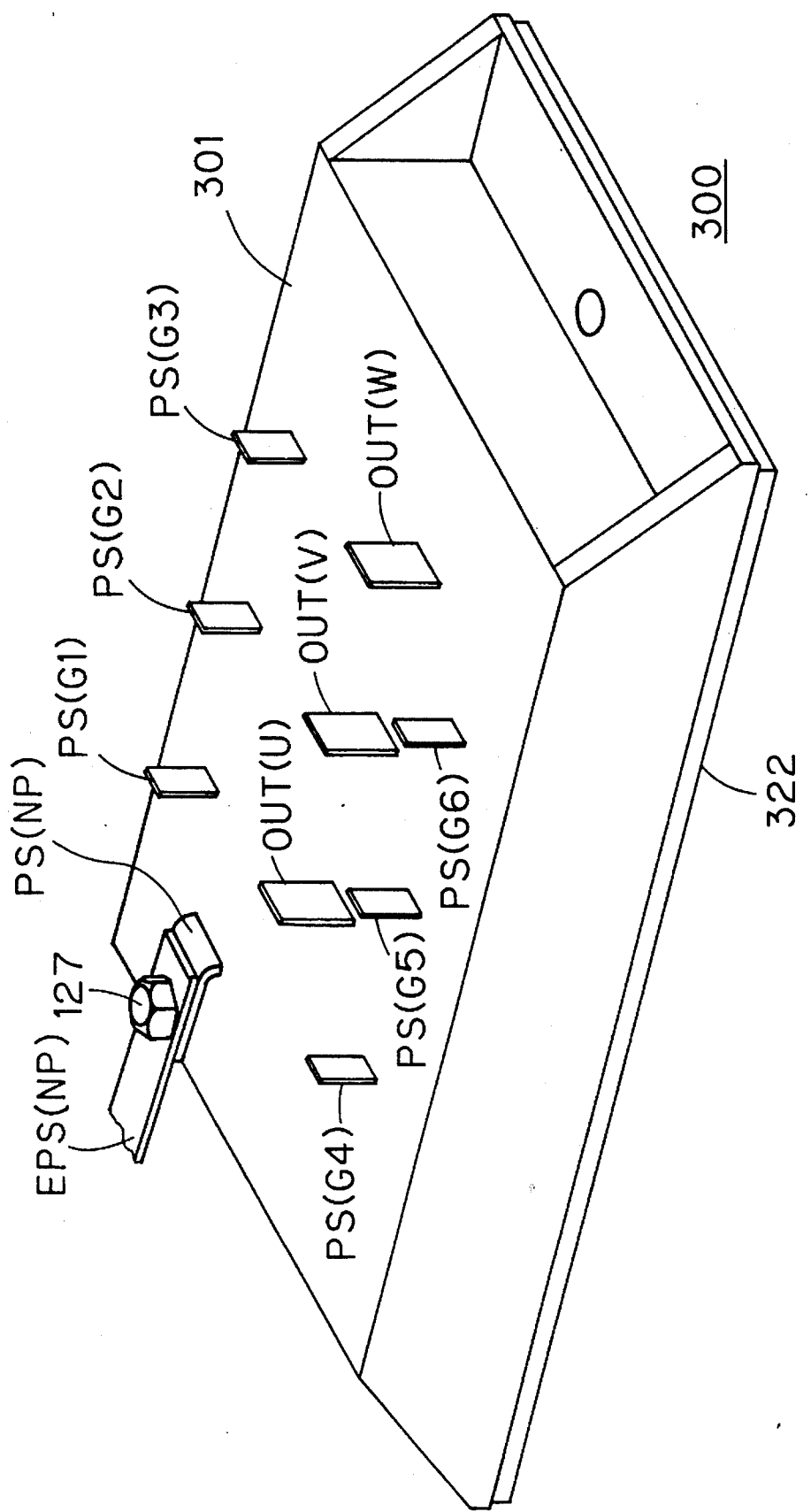
FIG. 12 is a perspective view showing the appearance of the device of the third preferred embodiment of the present invention.

FIG. 12 is a perspective view showing the appearance of the device 300. The copper base 322 is disposed at the bottom of a case 301. In the top surface of the case 301, the terminals mentioned above are partially projected outside. The power source terminals PS(P) and PS(N) are formed as one integrated power source terminal PS(NP) as shown in FIG. 1. The power source terminal PS(NP) is connected to the external power source terminals EPS(NP) through the bolt 127.

Figure 13:
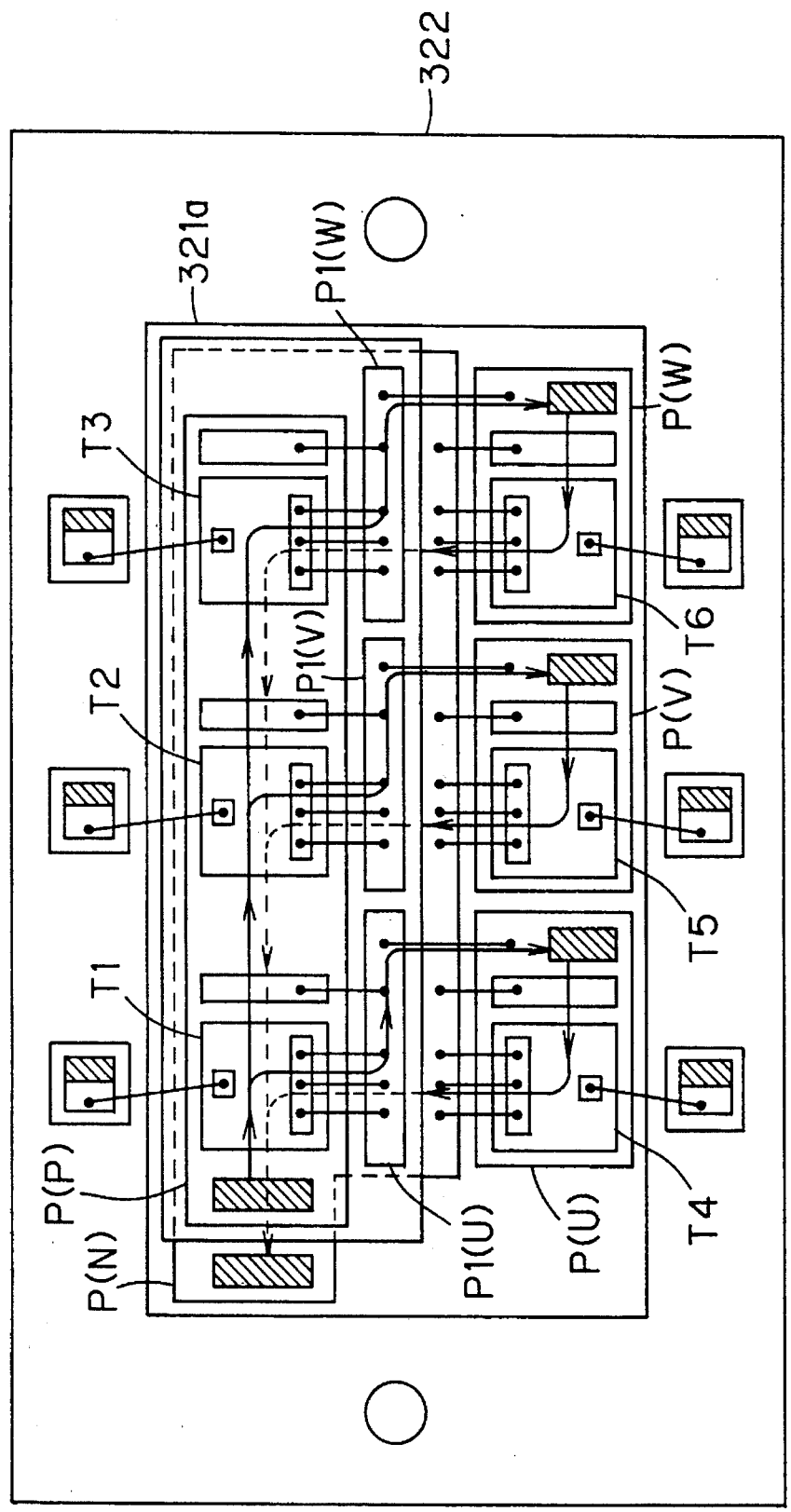
FIG. 13 is an explanatory diagram showing the paths of principal currents within the device in the third preferred embodiment of the present invention.
Figure 14:
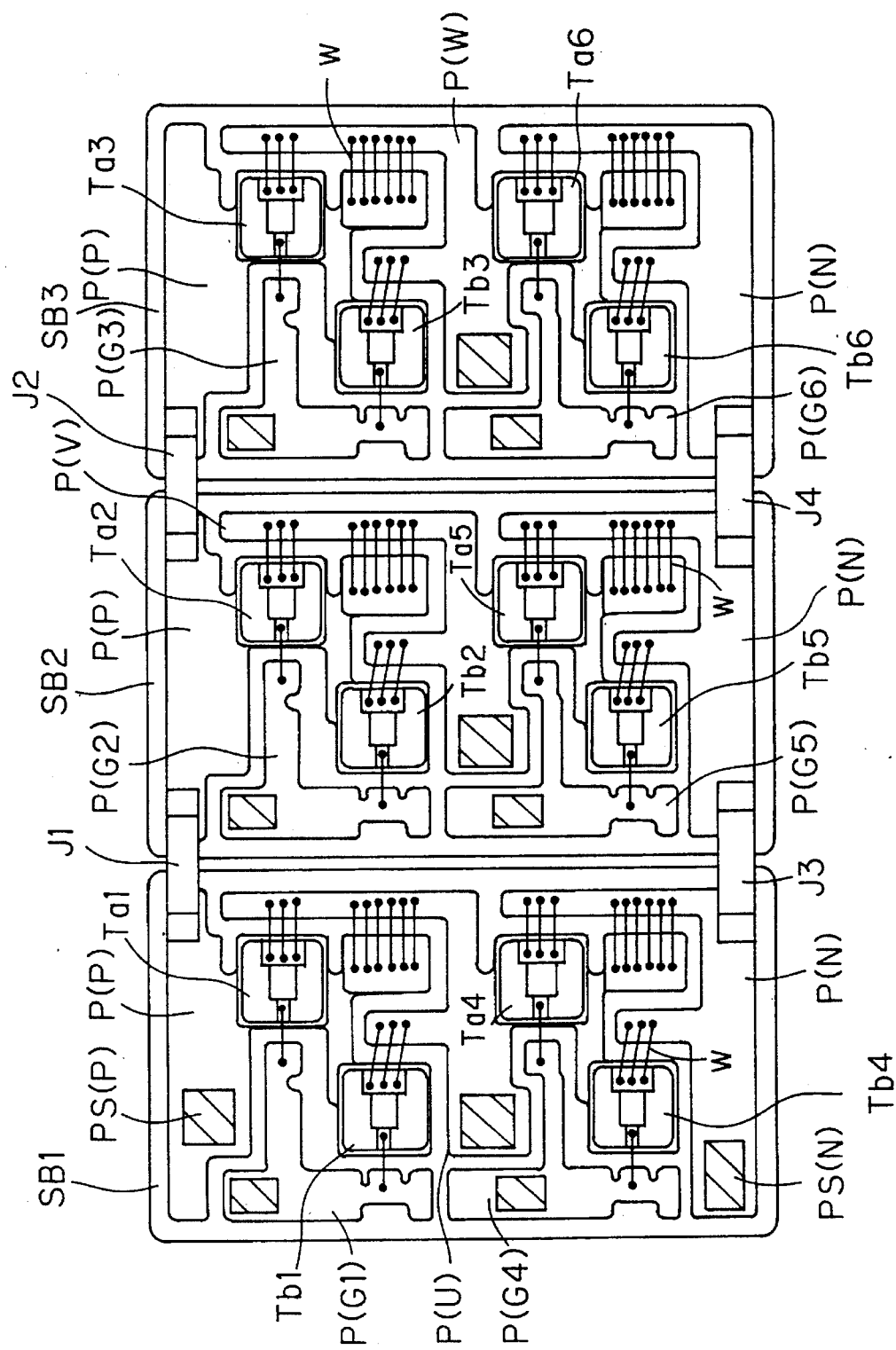
FIG. 14 is a plan view showing a circuit part in a conventional device.

FIG. 13 is an explanatory diagram showing the paths of principal currents within the device 300. As shown in FIG. 13, a power source current supplied from the power source terminal PS(P) is appropriately shunted into each one of the IGBT elements T1 to T3 through the wiring pattern P(P). The shunted currents are respectively outputted to outside from the output terminals OUT(U), OUT(V) and OUT(W) through the wiring patterns P1(U), P1(V) and P1(W) and the wiring patterns P(U), P(V) and P(W). Further, currents flow into the device 300 from the output terminals OUT(U), OUT(V) and OUT(W) when necessary. These currents entering the device 300 flow through the wiring patterns P(U), P(V) and P(W), respectively, join into one current at the wiring pattern P(N) and return to the power source terminal PS(N).

These currents intermittently flow in accordance with operations of the IGBT elements T1 to T6. Hence, if the parasitic inductance in the current path mentioned above is large, a high surge voltage will be developed in the path, causing operation failure and destruction of the circuit elements. In the device 300 of the third preferred embodiment, however, as shown in FIGS. 10 and 11, the wiring patterns P(P) and P(N) are disposed almost in contact each other with the circuit board body 321b sandwiched therebetween. In a region where these wiring patterns are formed, most portions (principal parts) of the wiring patterns are facing each other. The thickness of the circuit board body 321b is 0.5 mm to 1.5 mm, for instance. The power source terminals PS(P) and PS(N) connected to the wiring patterns P(P) and P(N) are also disposed close to each other. As a result, in the wiring patterns P(P) and P(N), currents flow close to each other with the circuit board body 321b sandwiched therebetween. The directions of the currents are opposite each other in the principal pails of the wiring patterns P(P) and P(N). Hence, the parasitic inductance present in the current path from the power source terminal PS(P) to the power source terminal PS(N) is suppressed. As a result, a surge voltage developed in the current path is restrained, thereby preventing malfunction and destruction of the circuit elements.

While the invention has been described in detail, the foregoing description is in all aspects illustrative and not restrictive. It is understood that numerous other modifications and variations can be devised without departing from the scope of the invention.

We claim:

1. A semiconductor power module comprising:

(a) a semiconductor element for electric power control;

(b) a circuit board, comprising:

(b-1) a circuit board body having an insulator; and (b-2) first and second wiring patterns disposed on one major surface of said circuit board in such a manner that principal parts of said first and said second wiring patterns are longitudinally adjacent each other, said first and said second wiring patterns transmitting first and second power source potentials to said semiconductor element for electric power control, respectively; and (c) a first and a second power source terminals which are connected to said first and said second wiring patterns, respectively, said first and second wiring patterns and said first and second power source terminals being disposed in such a manner that power source currents flow in said first and said second wiring patterns in substantially parallel but opposite directions.

2. A semiconductor power module comprising:

(a) a semiconductor element for electric power control; and (b) a power source terminal for transmitting first and second power source potentials to said semiconductor element for electric power control, wherein said power source terminal comprises:
(b-1) an insulator; and
(b-2) first and second conductors for transmitting said first and said second power source potentials, respectively, said first and said second conductors being electrically insulated from each other by said insulator, said first and said second conductors being longitudinally adjacent to each other and carrying power source currents in substantially parallel but opposite directions.

3. A semiconductor power module comprising:

(a) a semiconductor element for electric power control;

(b) a circuit board, comprising:
(b-1) a circuit board body having an insulator; and
(b-2) first and second wiring patterns respectively formed in first and second different planes which are parallel to a major surface of said circuit board body in such a manner that principal parts of said first and said second wiring patterns are longitudinally facing each other, said first and said second wiring patterns transmitting first and second power source potentials to said semiconductor element for electric power control, respectively; and (c) first and second power source terminals which are connected to said first and said second wiring patterns, respectively, said first and second wiring patterns and said first and second power source terminals being disposed in such a manner that power source currents flow in said first and second wiring patterns in substantially parallel but opposite directions.

4. A semiconductor power module comprising:

(a) a semiconductor element for electric power control; and (b) a power source terminal for transmitting first and second power source potentials to said semiconductor element for electric power control, said power source terminal comprising:
(b-1) a first insulator; and
(b-2) first and second conductors for transmitting said first and said second power source potentials, respectively, said first and said second conductors being electrically insulated from each other by said first insulator, said first and said second conductors being longitudinally adjacent to each other and carrying power source currents in substantially parallel but opposite directions; and (c) an external power source terminal connected to said power source terminal by a conductive connection member, said external power source terminal comprising:
(c-1) a second insulator; and
(c-2) third and fourth conductors for transmitting said first and said second power source potentials, respectively, said third and said fourth conductors being electrically insulated from each other by said second insulator, said third and said fourth conductors carrying power source currents in substantially parallel but opposite directions, wherein said power source terminal and said external power source terminal are connected by said connection member in such a manner that said first and said third conductors are in contact and hence in electrical connection to each other, and said second and said fourth conductors, each in contact to said connection member, are electrically coupled to each other through said connection member.

5. The semiconductor power module of claim 2, further comprising (c) a circuit board, said circuit board comprising
(c-1) a circuit board body having an insulator; and
(c-2) a first and second wiring patterns disposed on one major surface of said circuit board body in such a manner that principal parts of said first and said second wiring patterns are adjacent each other, said first and said second wiring patterns transmitting a first and second power source potentials to said semiconductor element for electric power control, respectively, said first and said second wiring patterns being connected to said first and said second conductors, respectively.

6. The semiconductor power module of claim 2, further comprising (c) a circuit board, said circuit board comprising
(c-1) a circuit board body having an insulator; and
(c-2) first and a second wiring patterns respectively formed in a first and second different planes which are parallel to a major surface of said circuit board body in such a manner that principal parts of said first and said second wiring patterns are facing each other, said first and said second wiring patterns transmitting a first and second power source potentials to said semiconductor element for electric power control, respectively, said first and said second wiring patterns being connected to said first and said second conductors, respectively.

7. The semiconductor power module of claim 6, wherein said first and said second planes respectively correspond to a first and a second major surfaces of said circuit board.

8. The semiconductor power module of claim 2, wherein said semiconductor element for electric power control comprises:

(a-1) a first switching element having a first high electric potential side output terminal and a first low electric potential side output terminal, said first high electric potential side output terminal being connected to said first power source potential, said first low electric potential side output terminal being connected to an end of a load, said first switching element alternately conducting and blocking a current flow between the pair of said output terminals; and (a-2) a second switching element having a second high electric potential side output terminal and a second low electric potential side output terminal, said second high electric potential side output terminal being connected to said end of said load and said first low electric potential side output terminal, said second low electric potential side output terminal being connected to said first power source potential, said second switching element alternately conducting and blocking a current flow between the pair of said output terminals.

9. The semiconductor power module of claim 8, wherein said first switching element comprises (a-1-1) a first insulative gate bipolar transistor having a first collector terminal, a first emitter terminal and a first gate terminal, said first collector terminal functioning as said first high electric potential side output terminal, said first emitter terminal functioning as said first low electric potential side output terminal, and wherein said second switching element comprises (a-2-1) a second insulative gate bipolar transistor having a second collector terminal, a second emitter terminal and a second gate terminal, said second collector terminal functioning as said second high electric potential side output terminal, said second emitter terminal functioning as said second low electric potential side output terminal.

10. The semiconductor power module of claim 9, further comprising (c) a control circuit for controlling operations of said semiconductor element for electric power control, said control circuit transmitting a control voltage signal to said first and said second gate terminals.

11. The semiconductor power module of claim 10, wherein said control circuit comprises
 (c-1) a first semiconductor element for transmitting a control voltage signal to said first gate terminal; and
 (c-2) a second semiconductor element for transmitting a control voltage signal to said second gate terminal.

12. The semiconductor power module of claim 11, further comprising (d) a main circuit board for mounting on its major surface said first and said second insulative gate bipolar transistors, said main circuit board comprising:
 (d-1) a main circuit board body having an insulator;
 (d-2) a first wiring pattern disposed on said main circuit board body, said first pattern connecting said first collector terminal to said first conductor; and
 (d-3) a second wiring pattern disposed on said main circuit board body, said second pattern connecting said second collector terminal to said second conductor.

13. The semiconductor power module of claim 12, wherein said control circuit further comprises (c-3) a control circuit board for mounting said first and said second semiconductor elements, said control circuit board being separated from said main circuit board.

14. The semiconductor power module of claim 13, further comprising (e) a plate having an excellent thermal conductivity mounted to a major surface of said main circuit board which is opposite to said major surface on which said first and said second insulative gate bipolar transistors are seated.

15. The semiconductor power module of claim 14, wherein said control circuit board and said main circuit board are arranged in an approximately parallel and opposite relation to each other.

16. The semiconductor power module of claim 15, wherein said first semiconductor element is disposed on said control circuit board at a position which faces said first insulative gate bipolar transistor to which said first semiconductor element provides a control voltage signal, and wherein said second semiconductor element is disposed on said control circuit board at a position which faces said second insulative gate bipolar transistor to which said second semiconductor element provides a control voltage signal.

17. The semiconductor power module of claim 16, further comprising (f) a frame member secured to said plate having an excellent thermal conductivity, wherein said frame member and said plate having an excellent thermal conductivity form a case, respectively as a side wall of said case and the bottom of said case, and wherein said case houses said main circuit board, said semiconductor element for electric power control, and said control circuit.

18. The semiconductor power module of claim 17, wherein said main circuit board body is made substantially of aluminum nitride.

19. The semiconductor power module of claim 17, wherein said main circuit board body is made substantially of ceramic.

20. The semiconductor power module of claim 17, wherein said plate having an excellent thermal conductivity is made substantially of copper.

21. The semiconductor power module of claim 1, wherein said first wiring pattern is a high potential wiring pattern and said second wiring pattern is a low potential wiring pattern.

22. The semiconductor power module of claim 2, wherein said first wiring pattern is a high potential wiring pattern and said second wiring pattern is a low potential wiring pattern.

23. The semiconductor power module of claim 3, wherein said first wiring pattern is a high potential wiring pattern and said second wiring pattern is a low potential wiring pattern.

24. The semiconductor power module of claim 4, wherein said first wiring pattern is a high potential wiring pattern and said second wiring pattern is a low potential wiring pattern.

25. A semiconductor power module comprising:
 (a) a semiconductor element for electric power control having a high power source potential electrode and a low power source potential electrode;
 (b) a circuit board, comprising:
  (b-1) a circuit board body having an insulator; and
  (b-2) first and second wiring patterns connected to said high and lower power source potential electrodes, respectively, and disposed on one major surface of said circuits and board body; and
 (c) first and second power source terminals which are connected to said first and second wiring patterns, respectively,
 said first and second wiring patterns and said first and second power source terminals being disposed in such a manner that principal parts of said first and said second wiring patterns are longitudinally adjacent each other, and
 said principal parts defining paths from said first power source terminal to said high power source potential electrode along said first wiring pattern and from said second power source terminal to said low power source potential electrode along said second wiring pattern, respectively.

26. A semiconductor power module comprising:
 (a) a semiconductor element for electric power control having a power source potential electrode and a low power source potential electrode; and
 (b) a power source terminal,
 wherein said power source terminal comprises:

(b-1) an insulator; and (b-2) first and second conductors being electrically insulated from each other by said insulator, principal parts of said first and said second conductors being longitudinally adjacent each other, an end of said first conductor being electrically coupled with said first high power source potential electrode and an end of said second conductor being electrically coupled with said low power source potential electrode, said ends of said first and said second conductors being on the same side with respect to said principal parts.

27. A semiconductor power module comprising:

(a) a semiconductor element for electric power control having high power source potential electrode and a low power source potential electrode;

(b) a circuit board, comprising:

(b-1) a circuit board body having an insulator; and (b-2) first and second wiring patterns respectively connected to said high and said low power source potential electrodes, and respectively formed in first and second different planes which are parallel to a major surface of said circuit board body; and (c) first and second power source terminals which are connected to said first and said second wiring patterns, respectively, said first and second wiring patterns and said first and second power source terminals being disposed in such a manner that principal parts of said first and second wiring patterns are longitudinally facing each other, and said principal parts defining paths from said first power source terminal to said high power source potential electrode along said first wiring pattern and from said second power source terminal to said low power source potential electrode along said second wiring pattern, respectively.

28. A semiconductor power module comprising:

(a) a semiconductor element for electric power control having a high power source potential electrode and a low power source potential electrode; and (b) a power source terminal, said power source terminal comprising:

(b-1) a first insulator; and (b-2) first and second conductors being electrically insulated from each other by said first insulator, principal parts of said first and said second conductors being longitudinally adjacent to each other, an end of said first conductor being electrically coupled with said high power source potential electrode and an end of said second conductor being electrically coupled with said low power source potential electrode, said ends of first and second conductors being on the same side with respect to said principal parts of said first and second conductors; and (c) an external power source terminal connected to said power source terminal by a conductive connection member, said external power source terminal comprising:

(c-1) a second insulator; and (c-2) third and fourth conductors being electrically insulated from each other by said second insulator, principal parts of said third and said fourth conductors being longitudinally adjacent to each other, wherein said power source terminal and said external power source terminal are connected by said connection member in such a manner that another end of said first conductor and an end of said third conductor are in contact and hence in electrical connection to each other, another end of said second conductor and an end of said fourth conductor, each in contact to said connection member, are electrically coupled to each other through said connection member, wherein said ends of said third and said fourth conductors are on the same side with respect to said principal parts of said third and said fourth conductors.

29. The semiconductor power module of claim 26, further comprising:

(c) a circuit board having first and second wiring patterns, said high and said low power source potential electrodes being connected to said first and said second wiring patterns, respectively, and said ends of said first and said second conductors being connected to said first and said second wiring patterns, respectively, so as to be electrically coupled with said high and said low power source potential electrodes through said first and said second wiring patterns, respectively; and (d) a housing case containing said semiconductor element and said circuit board;

wherein other ends of said first and said second conductors are exposed outside said housing case.

30. The semiconductor power module of claim 29, wherein said insulator and said first and said second conductors have shapes of flat belts, and said insulator is sandwiched in between said first and said second conductors.

31. The semiconductor power module of claim 28, further comprising:

(d) a circuit board having first and second wiring patterns, said high and low power source potential electrodes being connected to said first and second wiring patterns, respectively, and said ends of said first and said second conductors being connected to said first and said second wiring patterns, respectively, so as to be electrically coupled with said high and said low power source potential electrodes through said first and said second wiring patterns, respectively; and (e) a housing case containing said semiconductor element and said circuit board;

wherein other ends of said first and said second conductors are exposed outside said housing case, and said external power source terminal is disposed outside said housing case.

32. The semiconductor power module of claim 31, wherein said first and said second insulators and said first to said fourth conductors have shapes of flat belts, said first insulator is sandwiched in between said first and said second conductors, and said second insulator is sandwiched in between said third and said fourth conductors.

* * * * *